US012066371B2

(12) United States Patent
Kang

(10) Patent No.: US 12,066,371 B2
(45) Date of Patent: Aug. 20, 2024

(54) METHOD AND APPARATUS FOR REAL-TIME TOOL DEFECT DETECTION

(71) Applicant: TAIWAN SEMICONDUCTOR MANUFACTURING COMPANY LTD., Hsinchu (TW)

(72) Inventor: Wei-Da Kang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 214 days.

(21) Appl. No.: 17/461,531

(22) Filed: Aug. 30, 2021

(65) Prior Publication Data

US 2023/0065080 A1    Mar. 2, 2023

(51) Int. Cl.
*G01N 15/1434* (2024.01)
*G01N 15/14* (2024.01)
*H01L 21/67* (2006.01)

(52) U.S. Cl.
CPC ... *G01N 15/1434* (2013.01); *H01L 21/67017* (2013.01); *G01N 2015/1486* (2013.01)

(58) Field of Classification Search
None
See application file for complete search history.

(56) References Cited

U.S. PATENT DOCUMENTS

| 5,424,558 | A   | * | 6/1995 | Borden    | G01N 15/1425 |
|           |     |   |        |           | 250/573      |
| 2002/0062701 | A1 | * | 5/2002 | Guldi    | G01N 15/0227 |
|           |     |   |        |           | 73/865.5     |
| 2003/0147075 | A1 | * | 8/2003 | Otsuki   | C23C 16/4405 |
|           |     |   |        |           | 356/338      |
| 2017/0212030 | A1 | * | 7/2017 | Hasegawa | G01N 21/53   |
| 2018/0128744 | A1 | * | 5/2018 | Goradia  | G01N 15/14   |
| 2021/0255068 | A1 | * | 8/2021 | Collins  | G01N 1/2208  |

FOREIGN PATENT DOCUMENTS

CN     108663293 A  * 10/2018    ............. G01N 15/02

* cited by examiner

*Primary Examiner* — Rufus L Phillips
(74) *Attorney, Agent, or Firm* — WPAT LAW; Anthony King

(57) ABSTRACT

An apparatus for detecting a processing tool defect is provided. The apparatus includes a processing tool having a processing chamber configured to process a semiconductor wafer. The processing chamber includes a gas inlet and a gas outlet. An exhaust pipe is connected to the gas outlet of the processing chamber. A particle counter is configured to real-time measure a parameter of particles in the exhaust pipe. A method for detecting a processing tool defect is also provided in the present disclosure.

20 Claims, 7 Drawing Sheets

METHOD AND APPARATUS FOR REAL-TIME TOOL DEFECT DETECTION

BACKGROUND

The semiconductor integrated circuit (IC) industry has experienced exponential growth. Technological advances in IC materials and design have produced generations of ICs where each generation has smaller and more complex circuits than the previous generation. During manufacturing semiconductor ICs, semiconductor wafers are subjected to various processing operations at different processing tools. For example, to complete the fabrication of an IC device, various operations of deposition, cleaning, ion implantation, etching, and/or passivation operations are generally carried out in different processing tools.

It is known that the quality of an IC device fabricated is a function of the processes in which these device features are formed. The yield of an IC fabrication process is in turn a function of the quality of the device fabricated and a function of the cleanliness of the manufacturing environment in which the IC device is processed. The ever increasing trend of miniaturization of semiconductor IC devices requires more stringent control of the cleanliness in the fabrication process or the processing chamber in which the process is conducted. This leads to a more stringent control of the maximum amount of impurities and contaminants that are allowed in a processing chamber. Even a minutest amount of contaminants can significantly reduce the yield of the IC manufacturing process. For instance, the yield of the process can be drastically reduced by the presence of contaminating particles during deposition or etching of films which leads to the formation of voids, dislocations or short-circuits resulting in performance and reliability problems in the IC devices fabricated.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
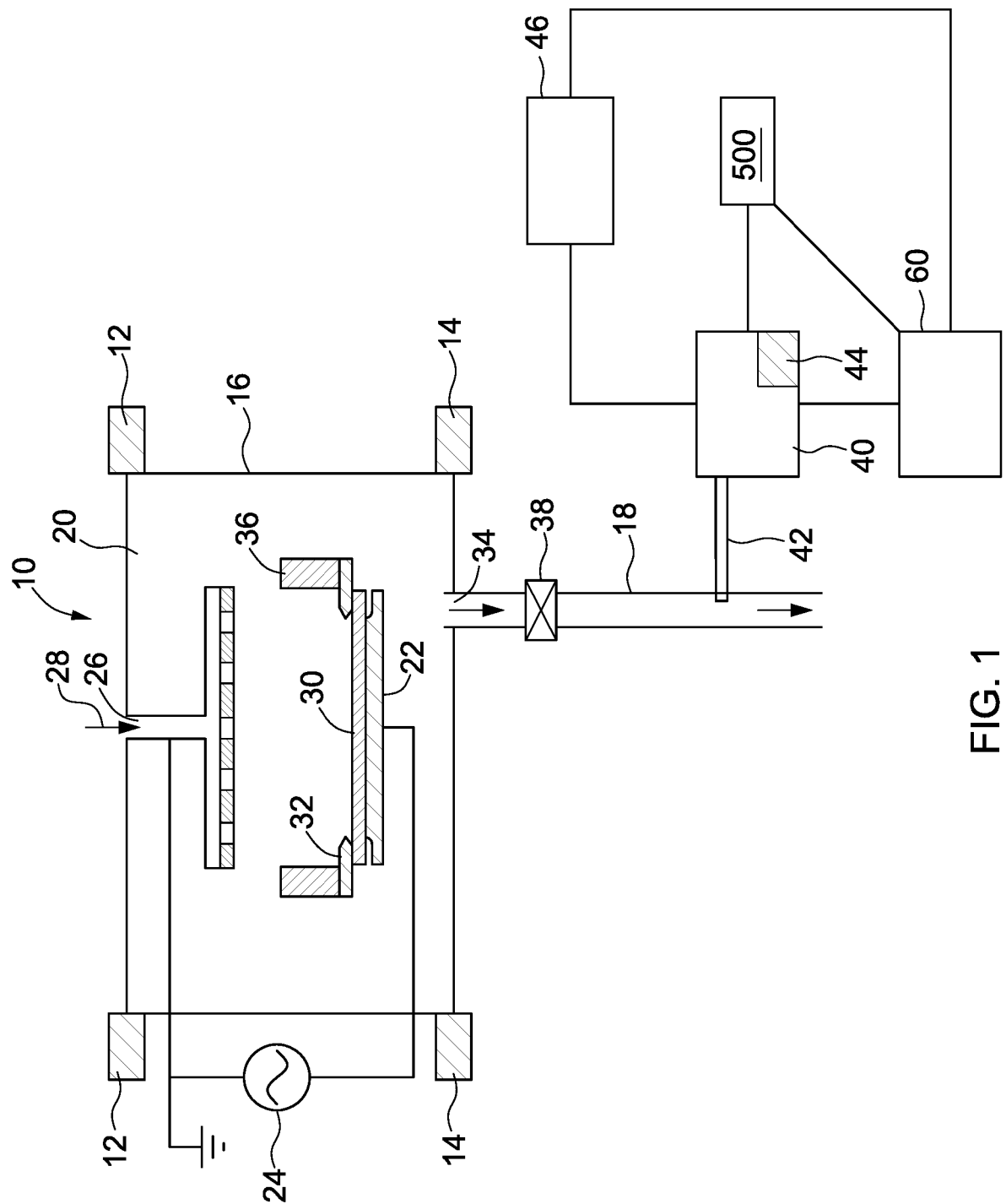
FIG. 1 shows a schematic diagram of an apparatus including a particle counter, in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "tower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

In recent years, contamination caused by particles has been reduced by the improvements made in the quality of clean rooms and by the increasing utilization of automated equipment which are designed to minimize exposure to human operators. However, even though contaminants from external sources have been reduced, various contaminating particles are still generated inside a processing chamber of a processing tool during the processing of semiconductor wafers. The sources of contaminating particles that have been identified include the interior walls of the processing chambers and/or other parts of the processing tool. For example, undesired particles may be produced when a processing tool part has an abnormal condition or reaches its service life. These contaminating particles may cause wafer scraps or other types of wafer defects. If a processing tool part or the wall of a processing chamber continuously produces contaminating particles, serious problem in an IC fabrication process would occur. The more contaminating particles are present, the more fabrication loss or yield loss will result. Therefore, processing chambers or processing tool parts are required to be timely (real-time) inspected and cleaned or replaced when the amount of the particles therein reaches to a certain level. In pursuit of a high quality, a high yield and a high performance of the semiconductor device, an apparatus and a method that can monitor the environment conditions, specifically, the particles parameters of the processing chambers of processing tools in real time (or in situ) are desired.

Embodiments of the present disclosure are directed to an apparatus for real-time monitoring and inspecting particles resulted from a processing tool configured to process a semiconductor wafer, and directed to a method for real-time detecting a processing tool defect. Such an apparatus is capable of monitoring the particle parameters in real time, such as the number, size, shape and/or composition of the particles in the air. Furthermore, the number of times in a certain time interval that each parameter is monitored can be adjusted depending on practical situations, such that any problems with the processing tool can be immediately reported, and the time required for dealing with particle problems and the possibility of defects forming in the tool may be reduced. Therefore, labor costs can be reduced, and a high yield and a high performance of the semiconductor device can be obtained.

According to various embodiments, by the method of the present disclosure the number, size, shape and/or composition of the particles in an exhaust pipe of a gas outlet connected to a wafer processing chamber may be obtained. In some embodiments, the method uses a statistical process control (SPC) system with the data with regard to the number, size, shape and/or composition of the particles from the exhaust pipe of the gas outlet to determine processing tool defects and thus control the cleanness of the processing chamber and the processing tool.

Refer to FIG. 1. FIG. 1 is a schematic diagram of an apparatus for real-time monitoring particles in a processing chamber of an etcher, in accordance with some embodiments of the present disclosure. Etcher 10 is a plasma etching chamber that is equipped with magnetic field enhancement generated by an upper rotating magnet 12 and a lower rotating magnet 14. The plasma etcher 10 includes a housing 16 that is typically made of a non-magnetic material such as aluminum which defines a chamber 20. A substrate holder 22 which is also a cathode is connected to a RF generator 24 and is in turn connected to a gas inlet (or showerhead) 26. The showerhead 26 also acts as an anode. A process gas 28 is supplied to chamber 20 through the gas inlet 26. A wafer 30 to be processed is positioned on the wafer holder or cathode 22.

The wafer 30 is normally held against the substrate holder 22 by a clamp ring 32. During a plasma etching process, a semi-conducting wafer 30 heats up significantly during the process and have to be cooled by a cooling gas from a cooling gas supply (not shown) such that heat can be transferred to a water cooled wafer holder 36. The function of the clamp ring 32 is also to hold the substrate 30 down against the pressure generated by the cooling gas. A gas outlet 34 is connected to a vacuum pump (not shown) by an exhaust pipe (pumping line) 18. The exhaust pipe 18 may evacuate the chamber via a throttle valve 38. The throttle valve 38 may be used to regulate the pressure and flow rate of the processing chamber. During an etching process, the upper rotating magnet 12 and the lower rotating magnet 14 function together to provide a magnetic field inside the process chamber 20.

In some embodiments, a particle counter 40 is configured to real-time measure a parameter of particles in the exhaust pipe. In the present disclosure, a particle counter indicates a machine, a device or a system that can detects and counts particles. The particle counter may further analyze other parameters, such as a shape or a size of the particles.

In some embodiments a particle counter 40 that detects and counts particles in the air is connected to the exhaust pipe 18 of the gas outlet 34 by a connection tube 42. The particle counter 40 may have an integrated pump 44 which produces a gas flow so that a sample of gas from the exhaust pipe 18 of the gas outlet 34 can be easily collected. In some embodiments, the inlet end of the connection tube 42 is located at the center of the exhaust pipe 18 of the gas outlet 34. In some embodiments, the inlet end of the connection tube 42 is located at the surface of the exhaust pipe 18 of the gas outlet 34. In some embodiments, the position and/or the direction of the inlet end of the connection tube 42 are adjustable. In some embodiments, the extending direction of the connection tube 42 is perpendicular to the extending direction of the exhaust pipe 18 of the gas outlet 34.

In some embodiments, the particle counter 40 is an aerosol particle counter which can determines the air quality by counting, sizing and/or shaping the particles in the air. In general, there are two types of aerosol particle counters, optical and condensation. In some embodiments, the particle counter 40 of the present disclosure can be either one of the two types. With optical particle counters, the particle passes through a high energy light source, then the amplitude of the light scattered or blocked is measured and the particle is counted. Optical particle counters have several different ways to detect and measure particles, such as light blocking (obscuration), light scattering, and direct imaging. The light blocking method can detect particles larger than a micrometer in size and is based on the amount of light the particle blocks when passing through the light source. The light scattering method is capable of detecting smaller size particles and is based on the amount of light that is redirected by the particle passing through the light source. Direct imaging may use light emitted by a laser as a source to illuminate the particles passing through and measure the area of the particles, like an automated microscope.

In some embodiments, the particle counter 40 can be an optical particle counter comprising a light source configured to project light on the particles, a light detecting component configured to detect the light reflected from particles, and a light analyzing component configured to analyze the light reflected from the particles and determine a parameter of the particles.

A condensation particle counter may count aerosol particles by first enlarging the particles and using the same as nucleation centers to create droplets in a super saturated gas. Condensation particle counters can detect particles as small as 2 nm, which cannot be easily detected with optical particle counters.

In some embodiments, the particle counter may also function as a particle shape analyzer. Particle shape has proven difficult to systematically analyze in the past. Modern computers and software now allow automated analysis of particle images to determine not just particle size, but also particle shape. A particle counter with rapid digital imaging techniques and software may determine both the sizes and shapes of particles in a gas sample. Such particle counter may record pictures of particles in the samples, then calculate the diameter, volume or more complex parameters based on the information needed. In some embodiments of the present disclosure, the particle counter may use dynamic particle imaging techniques and particles flow by the camera (similar to a microscope) and larger sample sizes can by analyzed. Particle size limits and analysis times vary by instrument. In some embodiments, a particle counter with particle imaging techniques can measure sizes ranging from about 0.5 um to about 30 mm and particle shape analysis takes about a few seconds to about 3 minutes per sample.

In some embodiments, the particle counter may have a smaller size and a lower flow rate, so it is ideal for certification of lower volumes of air from the exhaust pipe of the gas outlet. In some embodiments, a larger particle counter is used; it has a higher flow rate and is ideal for sampling larger volumes of air. In some embodiments, the particle counter has a fixed location and continuously monitors and analyzes the gas sample from the exhaust pipe of the gas outlet.

In some embodiments, the particle counter may be connected to a composition analyzer 60. The composition of the particles in a gas sample can be determined by the composition analyzer through various analytical methods, such as energy-dispersive X-ray spectroscopy (EDS) coupled with transmission electron microscopy (TEM), X-ray photoelectron spectroscopy (XPS), atomic absorption spectrometry (AA), inductively coupled plasma mass spectrometry (ICP-MS), inductively coupled plasma optical emission spectrometry (ICP-OES), etc. By comparing the characteristics and composition of the contaminating particles collected from the exhaust pipe with the known characteristics and material of the processing tool parts, the source of the contaminating particles can be identified. If a tool part is identified as the source of the contaminating particles, the tool part can be timely cleaned through a clean procedure or replaced with a new one.

In accordance with some embodiments, the particle counter 40 and/or a composition analyzer 60 is electrically connected to a processing component, for example, a computer 46. Alternatively, the data obtained from the particle counter 40 and/or a composition analyzer 60 is wirelessly transmitted to the processing component. Specifically, the number, size and/or shape of particles measured by the particle counter 40 as well as the composition of particles determined by the composition analyzer may be transmitted to the computer 46. The data with respect to the number, size, shape and/or composition of particles are processed and analyzed by the computer 46. In some embodiments of the present disclosure, the number, size, shape and/or composition of the particles are continuously detected and analyzed by the particle counter 40 and the computer 46. An abnormal condition of the processing chamber of the processing tool can be real-time identified by the computer 46, for example, when the real-time data show a significant change comparing with the data of a long term normal condition.

Figure 2:
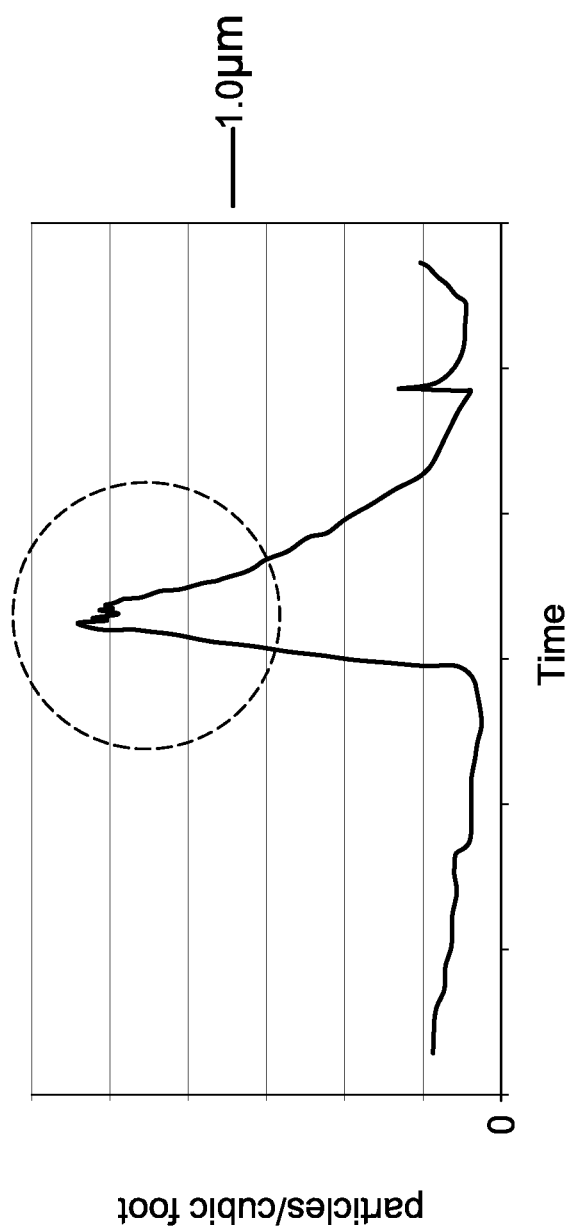
FIG. 2 shows a time-series chart regarding the number of particles processed by a computer, in accordance with an embodiment.

Refer to FIG. 2. For example, FIG. 2 illustrates time-series data with respect to the number of particles with a size more than 1.0 micron obtained by a particle counter, in accordance with a schematic embodiment of the present disclosure. As shown in FIG. 2, there is a spike (the circled part) in the chart. Comparing with the data of a long term normal condition, it can be analyzed and determined by a computer that the spike represents a tool abnormal condition. In some embodiments, the size, shape and/or composition of the contaminating particles may be further measured and analyzed. If the material and particle characteristics of various tool parts are obtained through experiments in advance, the specific tool part where the contaminating particles resulted from (that is, the tool part defect) can be further identified by comparing those data.

Figure 3:
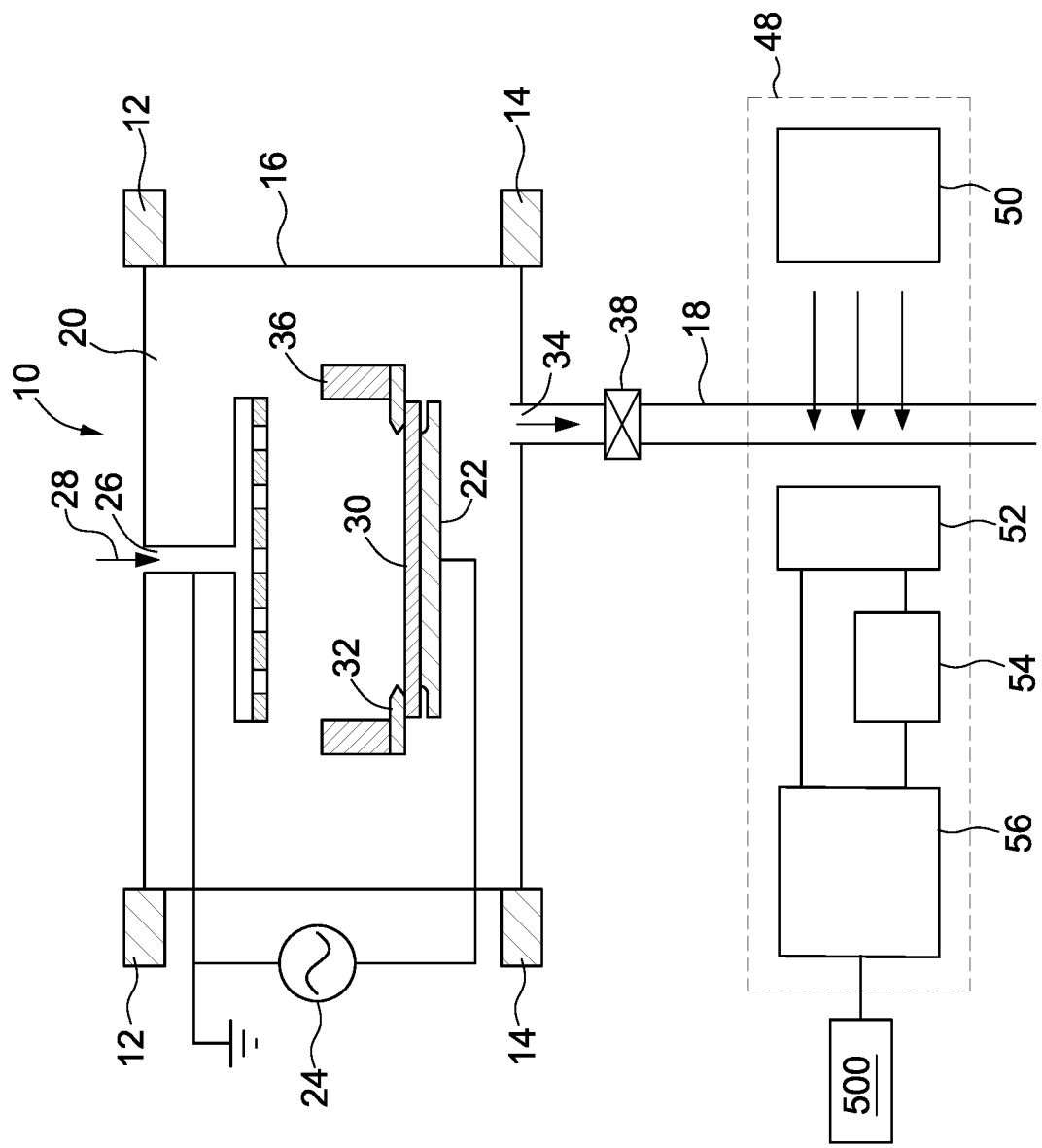
FIG. 3 shows a schematic diagram of an apparatus including a particle recognition system, in accordance with some embodiments.

Referring FIG. 3, in some embodiments of the present disclosure, the particle counting and analyses can be conducted by using a particle recognition system 48. The particle recognition system 48 may be disposed across the exhaust pipe 18 of the gas outlet 34 of the processing chamber. In some embodiments, the particle recognition system 48 includes a light source 50, a light detecting component 52, and a light analyzing component 54. In some embodiments, the particle recognition system 48 further includes a processing component 56.

The light source 50 is configured to project light passing through the exhaust pipe 18 of the gas outlet 34. In some embodiments, the light emitted from the light source 50 is high intensity light. In some embodiments, the exhaust pipe 18 of the gas outlet 18 has an opening so that the light emitted from the light source may pass through the opening. In some embodiments, the material of the exhaust pipe 18 of the gas outlet 34 where the light passes through includes a transparent material. In some embodiments, the emitted light illuminates particles when the particles pass through a transparent section of the exhaust pipe 18 of the gas outlet 34.

In some embodiments, the light detecting component 52 is configured to detect the light reflected from the particles. In some embodiments, the light detecting component 52 may locate one or more particles in the exhaust pipe 18 of the gas outlet 34.

In some embodiments, the light analyzing component 54 is configured to analyze the light reflected from particles to obtain a spectrum of the light. In some embodiments, the light detecting component 52 and the light analyzing component 54 can be integrated as one component or instrument.

The processing component 56 is operatively connected to the light detecting component 52 and the light analyzing component 54, in which the processing component 56 is programmed to compare a waveform of the obtained spectrum with a plurality of waveforms respectively in the spectrums of different substances, and determine the number, shape, size and/or composition of the particles based on the comparison. The inspection and measurements of the particles by the particle recognition system 48 may be based upon the principles of light scattering, light blocking (obscuration), and/or direct imaging as well as other composition analyzing methods as mentioned above.

In some embodiments, the light source 50 includes a laser such as a semiconductor laser or a comb laser, or other light generators that generate light with various wavelengths. The light source 50 projects light on the particles such that the light reflected from the particles can be detected by the light detecting component 52 and the light analyzing component 54 for subsequent inspection and analysis.

In some embodiments, the light detecting component 52 may include a photomultiplier detector or other light sensing elements such as charge-coupled device (CCD), backside illumination (BSI) sensor, or complementary metal-oxide-semiconductor (CMOS) sensor, for detecting the light reflected from the particles.

In some embodiments, the light analyzing component 54 is a spectrometer analyzer that analyzes a spectrum of the detected light. In some embodiments, the light analyzing component 54 further calculates the light components of the reflected light based on the analyzed spectrum. In some embodiments, the light components to be calculated include a lightness $L^*$, a color component $a^*$, or a color component $b^*$ in a Lab color space, or a combination thereof.

In some embodiments, the processing component 56 includes a single-core or a multi-core central processing unit (CPU) or any other programmable general purpose or specific purpose microprocessor, digital signal processor (DSP), programmable controller, application specific integrated circuits (ASIC), programmable logic device (PLD), other similar devices, or a combination of these devices. In some embodiments, the processing component 56 is a computer.

The processing component 56 is operatively connected to the light detecting component 52 and/or the light analyzing component 54. In some embodiments, the processing component 56 is configured to access and execute the programs recorded in a computer-readable storage medium (not shown), so as to implement a method of particle recognition or tool defect recognition in accordance with some embodiments of the present disclosure.

In accordance with some embodiments, the data with regard to the number, size, shape and/or composition of particles as determined by the processing component 56 are further processed and analyzed by the processing component 56. An abnormal condition of the processing chamber of the processing tool can be real-time identified by the processing component 56 if the real-time data show a significant change comparing the data of a long term normal condition.

Figure 4:
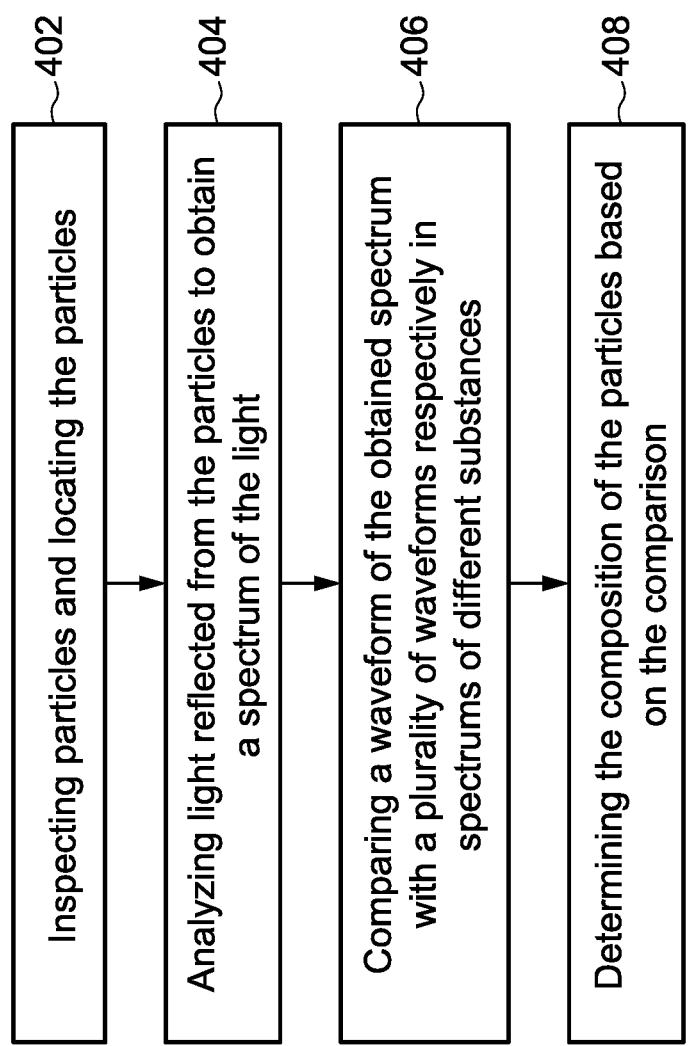
FIG. 4 is a flowchart illustrating a method of particle recognition in accordance with some embodiments of the present disclosure.

In some embodiments, the particle recognition system 48 is adapted for carrying out a method of particle recognition in accordance with some embodiments of the present disclosure. In detail, FIG. 4 is a flowchart illustrating a method of particle recognition in accordance with some embodiments of the present disclosure.

In step 402, the light detecting component 52 inspects particles and locates the particles in the exhaust pipe 18 of the gas outlet 34. In step 404, the light analyzing component 54 analyzes the light reflected from particles to obtain a spectrum of the light. In step 406, the processing component 56 compares a waveform of the obtained spectrum with a plurality of waveforms respectively in spectrums of different substances, such as Silver (Ag), Copper (Cu), Titanium (Ti), or Carbon (C), or any other element or chemical composition. In step 408, the processing component 56 determines the composition of the particles based on the comparison in step 406.

In some embodiments, aforesaid spectrums of substances are previously established by the processing component 56 by using historical data of analysis and stored in a spectrum database in a computer-readable storage medium (not shown) operably connected to the processing component 56. It is noted that, based on the determined composition of the particles, the processing component 56 may further derive the source of the tool defect. For example, if the composition of the defect is determined to contain carbon, it may be further determined that the suspect tool causing the defect is the wafer box.

Based on the above, the composition of the particles can be derived, and the processing tool that causes the particles can be determined, so as to enhance the capability of tool defect recognition, reduce the cycle time, and improve the business impact.

It should be appreciated that, while an apparatus and a method suited for detecting a part defect in a processing chamber of an etcher are described above, the present invention can be utilized in any other semiconductor processing chambers as well as processing tools as long as there is a particle contamination problem.

Figure 5:
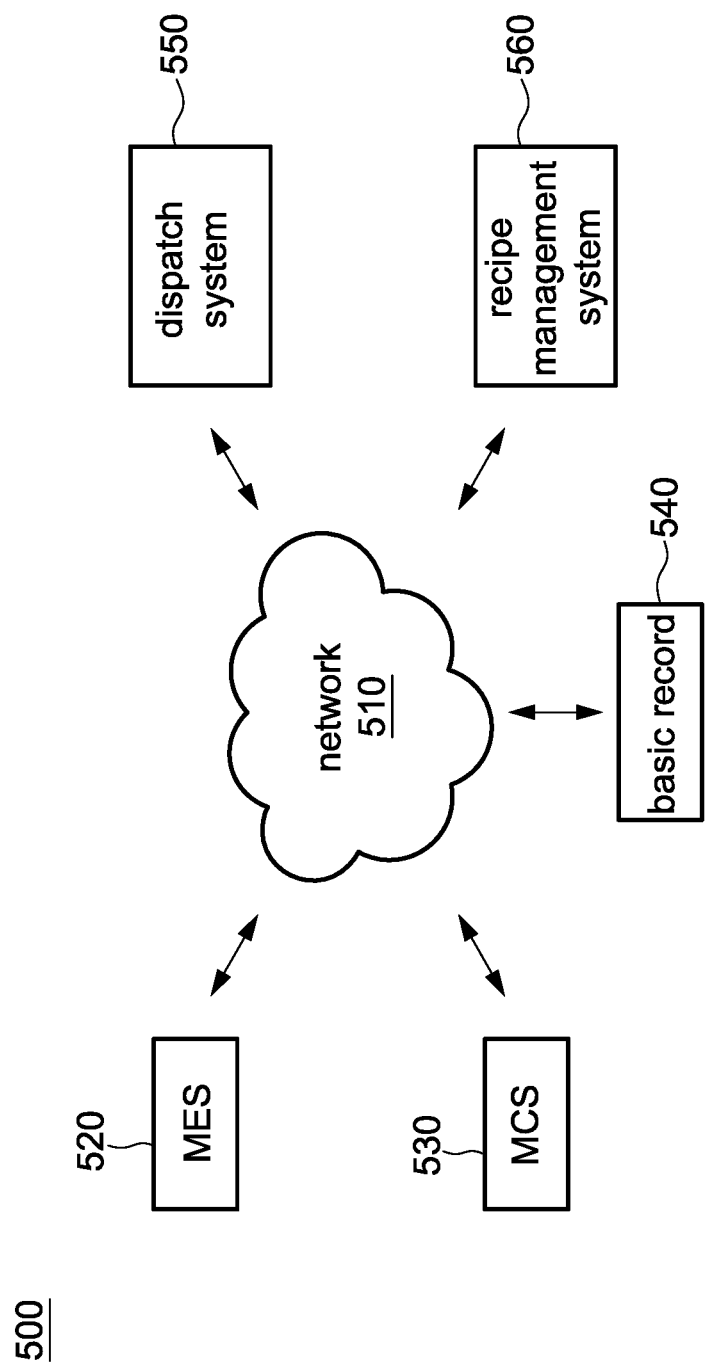
FIG. 5 is a schematic block diagram of a computer integrated manufacturing system in accordance with some embodiments.

In accordance with some embodiments, as shown in FIG. 1, FIG. 3 and FIG. 5, the particle counter 40 or the processing component 56 of particle recognition system 48 may be electrically connected to a computer integrated manufacturing (CIM) system 500. The number, size and/or shape of particles measured by the particle counter 40 as well as the composition of particles determined by a composition analyzer or those data obtained from the particle recognition system 48 may be transmitted to the computer integrated manufacturing (CIM) system 500.

In some embodiments, the CIM system 500 provides a complete automation of manufacturing Fabs, with all processes functioning under computer control. The CIM system 500 includes various sub-systems coupled together through a network 510 such as an intranet or the Internet. The CIM system 500 includes a manufacturing execution system (MES) 520 designed for overseeing the manufacture of semiconductor products, assigning inventory, moving inventory, scheduling tools, and other proper tasks. The CIM system 500 also includes a material control system (MCS) 530 designed for controlling material transportation and other material handling among process tools and/or among manufacturing sites. The CIM system 500 includes a basic record (BR) 540 that is a centralized system for defining a unified process flow (also referred to as process flow definition system, or PFDS). The BR 540 may be designed additionally for defining a portable data package to a mobile object such as a wafer. The CIM system 500 further includes a dispatch system 550 designed for dispatching products and other mobile objects among processing tools and manufacturing sites or facilities. The CIM system 500 further includes recipe management system 560 designed for managing and maintaining various processing recipes associated with various processing tools and various products. The CIM system 500 may further include other components for managing, coordinating, and maintaining various manufacturing tools, products, processing recipes, material control, and other manufacturing related tasks. For example, the CIM system 500 may further include a database for keeping and maintaining various manufacturing related information such as wafer or lot history, tool history, work-in-progress, and yield data. In some embodiments, MCS 530 is used for implementing Automated Material Handling System (AMHS) activities.

In some embodiments, after the particle counter 40 or the particle recognition system 48 records the number of the particles from the exhaust pipe 18 of the gas outlet 34 of a processing chamber, the CIM system 500 determines the cleanness of the processing chamber according to the number of the particles and a predetermined number. If the number is smaller than the predetermined number, the chamber is determined to be clean. In some embodiments, the cleanness of the processing chamber 20 is determined by using a statistical process control (SPC) system, thereby controlling the cleanness of the processing chamber 20. In some embodiments, the number, size, shape and/or composition of the particles is timely collected and linked to the SPC system, and a SPC chart is produced by the SPC system. The SPC chart can be used for tracking and analyzing manufacturing process variations, and identifying processing tool defects, thereby performing quality control timely.

Figure 6:
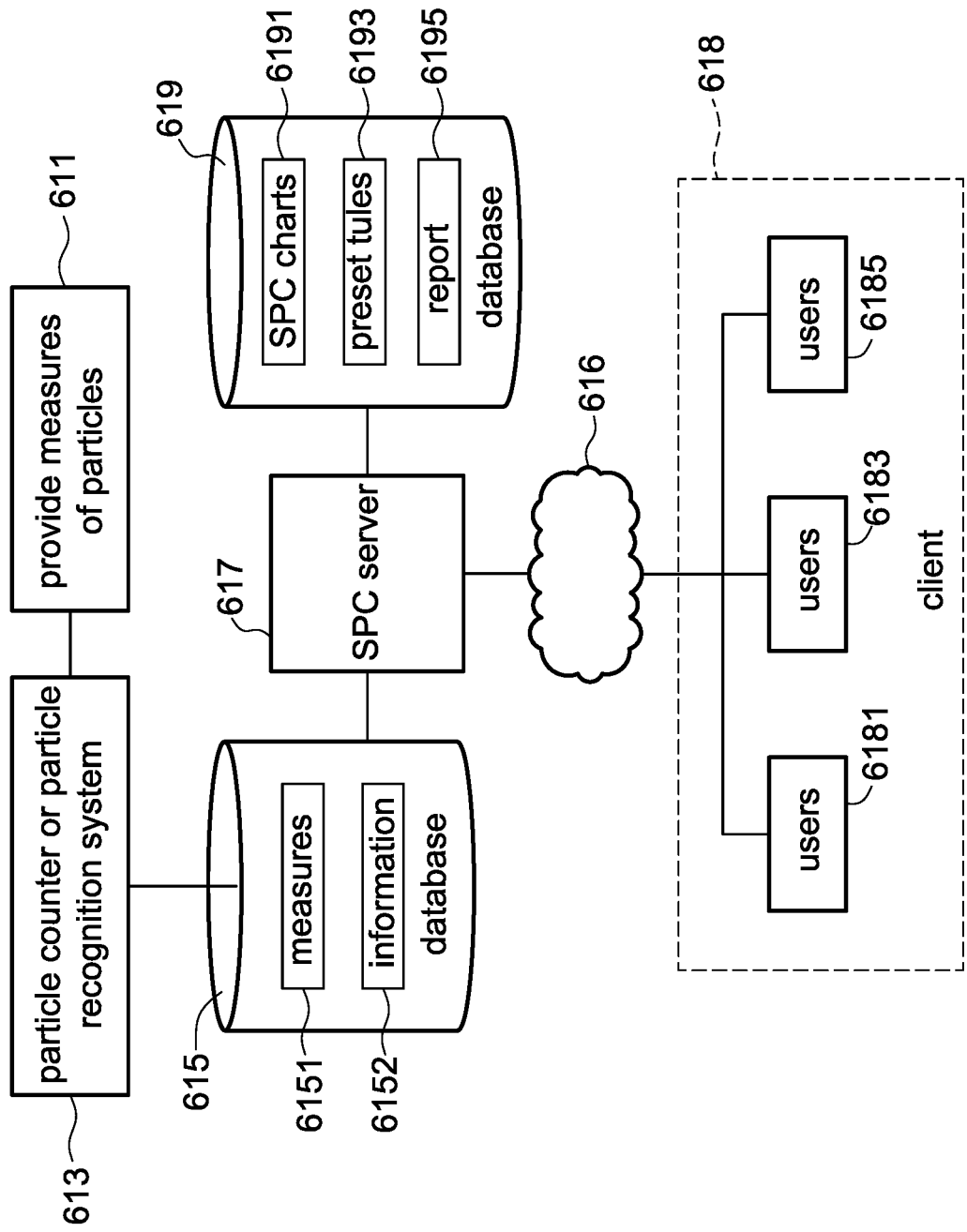
FIG. 6 is a schematic view of some embodiments implementing statistical process control (SPC).

FIG. 6 is a schematic view of an embodiment of a manufacturing system implementing statistical process control (SPC) in accordance with one or more embodiments of the present disclosure. Specifically, a processing tool 611 is operative to process wafers. A particle counter or a particle recognition system 613 measures particle characteristics from the processing tool 611. The characteristics comprise number, size, shape and/or composition of the particles. The measurement can be performed online or offline. The measurements 6151 are stored in a database 615. The database 615 also stores information 6152 pertaining to operating status of the processing tool 611. A statistical process control (SPC) server 617, connected to database 615, retrieves the measurements 6151 and information 6152 from database 615, and converts the measurements 6151 and information 6152 to SPC charts 6191. The SPC charts 6191 can be stored in a SPC database 619. The SPC server 617 can process the measures obtained from the particle counter or the particle recognition system 613. The SPC server 617 can also process different types of measure from a plurality of other metrology tools. The SPC charts 6191 are further categorized into a plurality of groups based on particle characteristics thereof. SPC charts within one of the groups are processed by SPC server 617 according to preset rules 6193 to generate a report 6195. The report 6195 identifies the SPC chart violating the preset rules 6193. The report 6195 may be transmitted to client 618 through network 616. Client 618 comprises computer devices for users 6181, 6183, and 6185. Network 616 can be an intranet or Internet.

Figure 7:
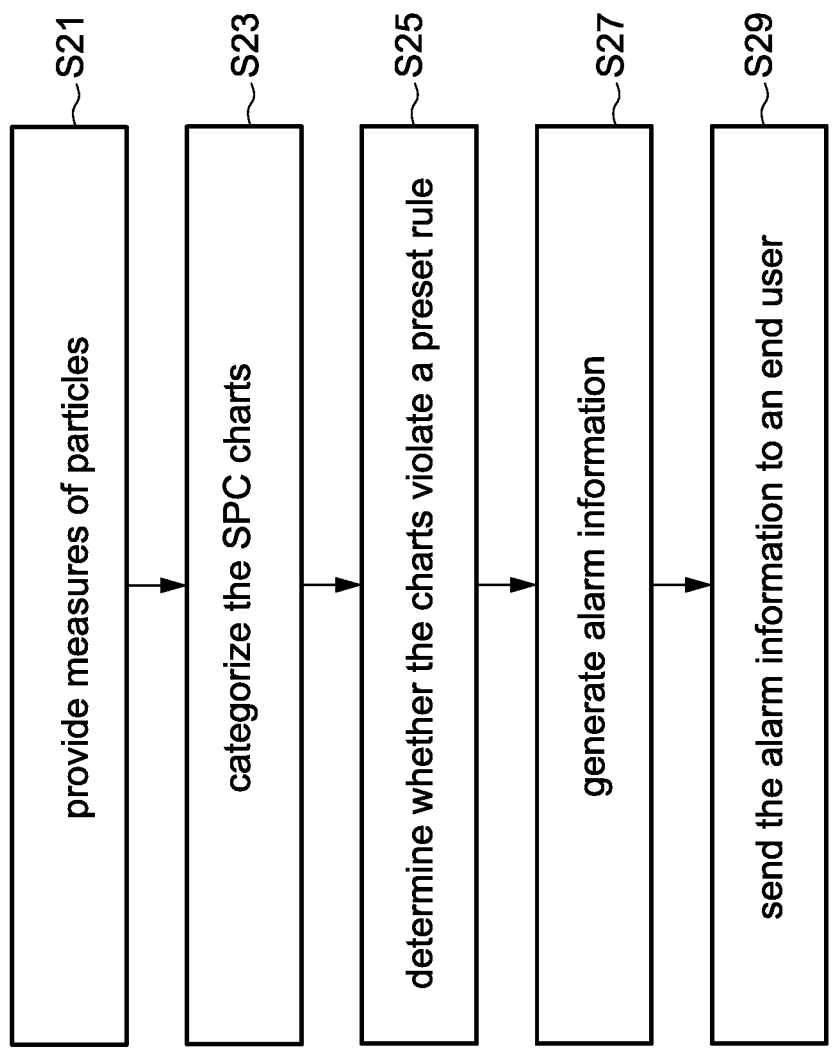
FIG. 7 is a flow chart of an embodiment of a statistical process control (SPC) method.

The processing algorithm implemented in SPC server 617 is detailed in the flowchart of FIG. 7. Measurements of particles stored in database 615 are first retrieved for generating SPC charts (step S21). The SPC charts are categorized into a plurality of groups based on particle characteristics thereof (step S23). The SPC charts can be further processed when necessary. It is determined whether the charts of a particular group violate a preset rule (step S25). When a SPC chart violates the preset rule, alarm information is generated identifying the chart violating the rule (step S27). The alarm information is sent to a user through e-mail or other methods (step S29). The alarm information can be presented as an alarm report or other type of documents. When a user is informed of the alarm information, the user can quickly and timely identify the source (for example, a processing tool part) of the particles and timely resolve the problem by cleaning or replacing the source.

The preset rule is designed to meet special requirements, and differs with groups of SPC charts, defined using a manufacturing constant and/or a statistical parameter, or a combination thereof. Data in a SPC chart can be further processed before rule checking. For example, data in a SPC chart can be differentiated, integrated, or filtered to generate another type of chart. The rule checking focuses on an indicator variable of the SPC chart. The indicator variable can be derived from the latest data entry in the chart, a preset number of data entries, and/or data entries collected within a preset time period. A plurality of preset rules can be provided for detecting the presence of abnormal data of particles. These rules may be defined by at least one manufacturing constant and/or statistical parameter. The manufacturing constant may be a manufacturing target, an upper specification limit, a lower specification limit, or other pertinent constant. The statistical parameter may be a statistical parameter specifying manufacturing capability.

Embodiments of this disclosure provide an apparatus and method for real-time monitoring processing tool defects through a particle counter or a particle recognition system preferably together with a computer and/or a statistical process control method. By timely monitoring and identifying the particle parameters from an exhaust pipe of a gas outlet of a processing chamber, concerns of defects or low performance resulted from processing tool parts can be mitigated. As a result, a product yield of the semiconductor wafer is improved. Moreover, since the time required for dealing with particle problems and the possibility of defects forming in the tool is reduced, a manufacturing cost is therefore reduced.

In accordance with some embodiments, an apparatus is provided. The apparatus includes a processing tool having a processing chamber configured to process a semiconductor wafer. The processing chamber includes a gas inlet and a gas outlet. An exhaust pipe is connected to the gas outlet of the processing chamber. The apparatus further includes a particle counter. The particle counter is configured to real-time measure a parameter of particles in the exhaust pipe.

In accordance with some embodiments, an apparatus is provided. The apparatus includes a processing tool having a processing chamber configured to process a semiconductor wafer, wherein the processing chamber includes a gas inlet and a gas outlet. An exhaust pipe is connected to the gas outlet of the processing chamber. The apparatus further has a particle recognition system including a light source, a light detecting component and a light analyzing component, wherein the light source is configured to project light passing through the exhaust pipe, the light detecting component is configured to detect the light reflected from particles in the exhaust pipe, and the light analyzing component is configured to analyze the light reflected from the particles and determine a parameter of the particles in the exhaust pipe.

In accordance with some embodiments, a method for detecting a processing tool defect is provided. The method includes providing a processing tool having a processing chamber equipped with a gas inlet and a gas outlet, wherein an exhaust pipe is connected to the gas outlet of the processing chamber; conducting a chemical or physical process on a wafer in the process chamber; flowing a gas from the gas inlet to the exhaust pipe, and real-time detecting a parameter of particles in the exhaust pipe.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
   a processing tool comprising a processing chamber configured to process a semiconductor wafer, wherein the processing chamber comprises a gas inlet and a gas outlet;
   an exhaust pipe connected to the gas outlet of the processing chamber;
   a throttle valve in the exhaust pipe; and
   an optical particle counter, wherein the optical particle counter is configured to real-time measure a parameter of particles in the exhaust pipe, wherein the optical particle counter is connected to the exhaust pipe through a connection tube, and the particles are delivered from the exhaust pipe to the optical particle counter through the connection tube, and wherein a position of an inlet end of the connection tube is adjustable,
   and
   wherein the optical particle counter comprises:
      a comb laser;
      a photomultiplier detector;
      a spectrometer analyzer, and
      an integrated pump.

2. The apparatus of claim 1, further comprising a computer, wherein the computer analyzes the parameter of particles.

3. The apparatus of claim 1, wherein the parameter of particles is a number of the particles, a size of the particles or a shape of the particles.

4. The apparatus of claim 1, further comprising a composition analyzer configured to determine a composition of the particles in the exhaust pipe.

5. The apparatus of claim 1, wherein the optical particle counter is electrically connected to a computer integrated manufacturing (CIM) system.

6. The apparatus of claim 1, further comprising a vacuum pump connected to the gas outlet by the exhaust pipe.

7. The apparatus of claim 1, wherein the inlet end of the connection tube is located at the surface of the exhaust pipe.

8. The apparatus of claim 1, wherein the inlet end of the connection tube is located at the center of the exhaust pipe.

9. An apparatus, comprising:
 a processing tool comprising a processing chamber configured to process a semiconductor wafer, wherein the processing chamber comprises a gas inlet and a gas outlet;
 an exhaust pipe connected to the gas outlet of the processing chamber;
 a throttle valve in the exhaust pipe; and
 an optical particle counter, wherein the optical particle counter is configured to real-time measure a parameter of particles in the exhaust pipe, and wherein the optical particle counter is connected to the exhaust pipe through a connection tube, and the particles are delivered from the exhaust pipe to the optical particle counter through the connection tube, and wherein a direction of an inlet end of the connection tube is adjustable, and
 wherein the optical particle counter comprises:
  a comb laser;
  a photomultiplier detector, and
  a spectrometer analyzer,
 and
 wherein the optical particle counter is electrically connected to a computer integrated manufacturing (CIM) system comprising a manufacturing execution system.

10. The apparatus of claim 9, wherein the optical particle counter is connected to a composition analyzer.

11. The apparatus of claim 10, wherein the optical particle counter or the composition analyzer is electrically connected to a processing component.

12. The apparatus of claim 11, wherein the processing component is a computer.

13. The apparatus of claim 10, wherein the optical particle counter and the composition analyzer are electrically connected to a processing component.

14. The apparatus of claim 9, wherein data obtained from the optical particle counter is wirelessly transmitted to a processing component.

15. An apparatus, comprising:
 a processing tool comprising a processing chamber configured to process a semiconductor wafer, wherein the processing chamber comprises a gas inlet and a gas outlet;
 an exhaust pipe connected to the gas outlet of the processing chamber;
 a throttle valve in the exhaust pipe; and
 an optical particle counter, wherein the optical particle counter is configured to real-time measure a parameter of particles in the exhaust pipe, and wherein the optical particle counter is connected to the exhaust pipe through a connection tube, and the particles are delivered from the exhaust pipe to the optical particle counter through the connection tube, and wherein a position and a direction of an inlet end of the connection tube is adjustable, and
 wherein the optical particle counter comprises:
  a comb laser;
  a photomultiplier detector; and
  a spectrometer analyzer.

16. The apparatus of claim 15, wherein the optical particle counter is connected to a composition analyzer.

17. The apparatus of claim 16, wherein the optical particle counter or the composition analyzer is electrically connected to a processing component.

18. The apparatus of claim 16, wherein the optical particle counter and the composition analyzer are electrically connected to a processing component.

19. The apparatus of claim 18, wherein the processing component is a computer.

20. The apparatus of claim 15, wherein the optical particle counter further comprises a digital imaging software.

* * * * *